United States Patent
Brady et al.

Patent Number: 5,314,841
Date of Patent: May 24, 1994

[54] METHOD OF FORMING A FRONTSIDE CONTACT TO THE SILICON SUBSTRATE OF A SOI WAFER

[75] Inventors: Frederick T. Brady, Chantilly; Nadim F. Haddad, Oakton, both of Va.

[73] Assignee: International Business Machines Corporation, Armonk, N.Y.

[21] Appl. No.: 54,992

[22] Filed: Apr. 30, 1993

[51] Int. Cl.⁵ .......................................... H01L 21/44
[52] U.S. Cl. ..................................... 437/203; 437/21; 437/28; 437/34; 437/40
[58] Field of Search ...................... 437/21, 41, 40, 203, 437/28, 29, 34; 148/DIG. 150

[56] References Cited

U.S. PATENT DOCUMENTS

| | | |
|---|---|---|
| 3,911,465 | 10/1975 | Foss et al. |
| 4,400,865 | 8/1983 | Goth et al. |
| 4,479,297 | 10/1984 | Mizutani et al. ............ 437/21 |
| 4,888,304 | 12/1989 | Nakagawa et al. |
| 4,980,732 | 12/1990 | Okazawa |
| 5,057,450 | 10/1991 | Bronner et al. |
| 5,075,237 | 12/1991 | Wu ...................... 148/DIG. 150 |
| 5,081,062 | 1/1992 | Vasudev et al. .............. 437/21 |
| 5,151,374 | 9/1992 | Wu ............................ 437/41 |
| 5,166,086 | 11/1992 | Takeda et al. ............... 437/41 |
| 5,185,535 | 2/1993 | Farb et al. .................. 437/21 |
| 5,188,973 | 2/1993 | Omura et al. .............. 437/203 |

Primary Examiner—Brian E. Hearn
Assistant Examiner—Kevin M. Picardat
Attorney, Agent, or Firm—Mark A. Wurm

[57] ABSTRACT

A method of having a frontside contact to a SOI wafer is described. Before any device processing steps a trench is etched through the SOI layers to the substrate. This trench is maintained during device processing and opened during source/drain implantation. At metallization an ohmic contact is made to the substrate.

5 Claims, 3 Drawing Sheets

METHOD OF FORMING A FRONTSIDE CONTACT TO THE SILICON SUBSTRATE OF A SOI WAFER

BACKGROUND OF THE INVENTION

This invention relates to device processing of Silicon-On-Insulator wafers, and more particularly, relates to a method of forming a frontside contact to the silicon substrate of a SOI wafer.

SOI technology has been shown to have many advantages over bulk silicon technology. These advantages include higher speed, lower power and immunity to single event radiation upset. However, there are certain challenges encountered in actual product fabrication of silicon-on-insulator devices. One of these challenges is the need to bias or ground the silicon substrate. In many packaging processes, the substrate is in electrical contact with the package ground. Relying on this approach has several drawbacks such as extra processing must be done to the backside of the wafer to ensure a good electrical contact to the package. In some packaging techniques the silicon chip is flip chip bonded so that the substrate does not make contact with the package ground. In certain instances it is desirable to apply a bias to the substrate which is different than the package ground pin.

The goals of alleviating the drawbacks of not grounding the substrate, providing for ease of contacting the substrate from the frontside of a SOI wafer, and allowing for biasing the substrate through the electrically isolating buried oxide layer has resulted in the present invention.

SUMMARY OF THE INVENTION

In accordance with the objects, features and advantages of the invention the following process can be used to provide a frontside contact to SOI wafers.
1. Define substrate contact rings, and any other areas in which a substrate contact is desired.
2. Etch a trench in the exposed contact rings down to the substrate.
3. Strip the resist and resume standard processing.
4. Cover the substrate contact rings with photoresist when implanting a dopant of the opposite type from the substrate.
5. Open the contact ring during implantation, particularly source/drain implantation, when doping with a dopant of the same type as the substrate.
6. Resume standard processing to form the remainder of the device.

BRIEF DESCRIPTION OF THE DRAWINGS

The foregoing objects, features and advantages of the invention will be more fully understood with reference to the description of the best mode and the drawings wherein.

DESCRIPTION OF THE PREFERRED EMBODIMENT

Figure 1:
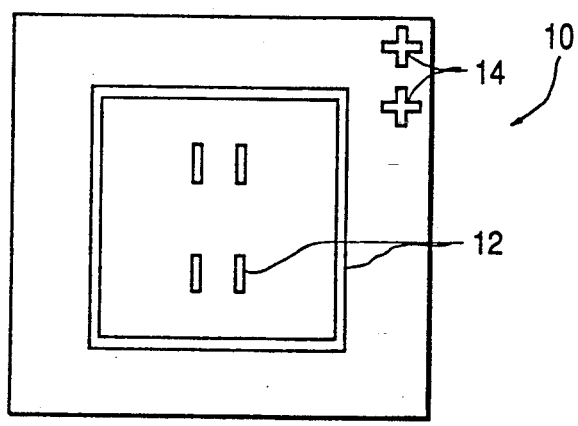
FIG. 1 is a top plan view of the substrate contact.
Figure 2A:
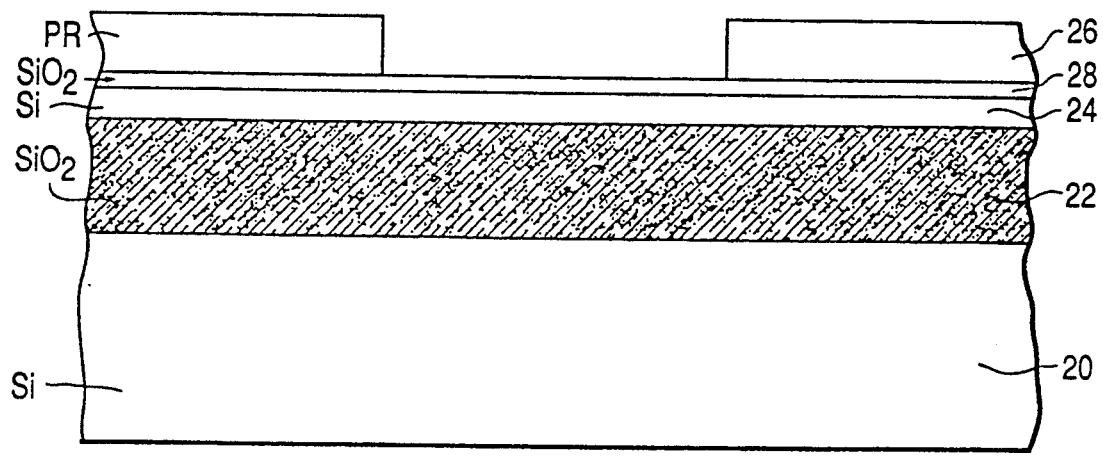
FIGS. 2a and b are cross sectional views of the etching of the contact.
Figure 2B:
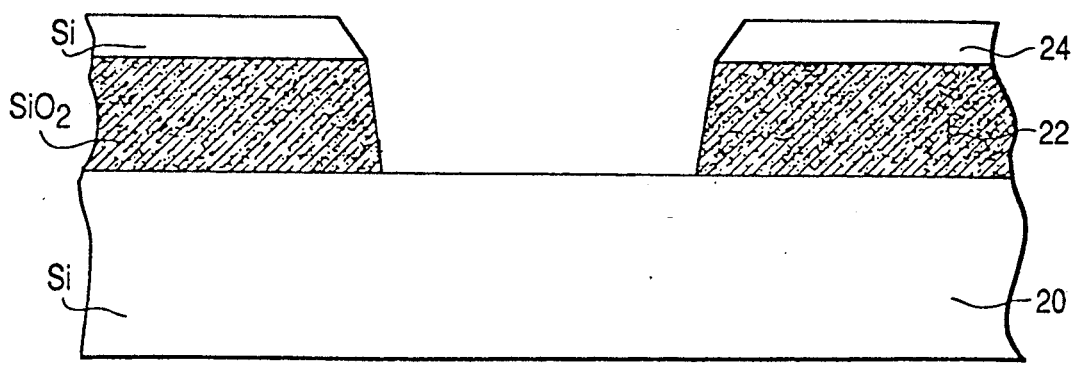

To carry out the present invention, prior to any other step, the substrate contact area is defined by a ring or opening around each circuit as shown in FIG. 1. For simple structures, the contact area can be a small rectangle or other such shape, not ringing the device, but in the vicinity of the device. A trench is then etched in the exposed areas 12 through the silicon film and the buried oxide stopping on the substrate. This can be seen in more detail in FIG. 2a where the silicon substrate 20 and an SiO2 layer 22 with an overlying Si layer 24 is coated with photoresist 26. A thin oxide (~100 Ang.) 28 is used to separate the photoresist from the silicon film to avoid contamination problems. Using the photoresist as a mask, the silicon layer 24 is etched by standard means followed by a standard etching of the SiO2 22 down to the silicon surface 20. The photoresist is removed and the cross sectional area as shown in FIG. 2b results. It is desirable that the slope at the edges of the etched regions be very gentle so that subsequent processing of photoresist and deposited layers will conformally coat the trench region.

Special alignment marks are put on the substrate contact mask and the following mask so that the two photolithographite levels between the first device processing step and the trench definition step will overlay correctly. These marks are shown as 14 in FIG. 1.

During device processing which employs a dopant of opposite doping type than the substrate, the trench area should be masked with photoresist or other material to prevent implantation into the substrate.

Figure 3A:
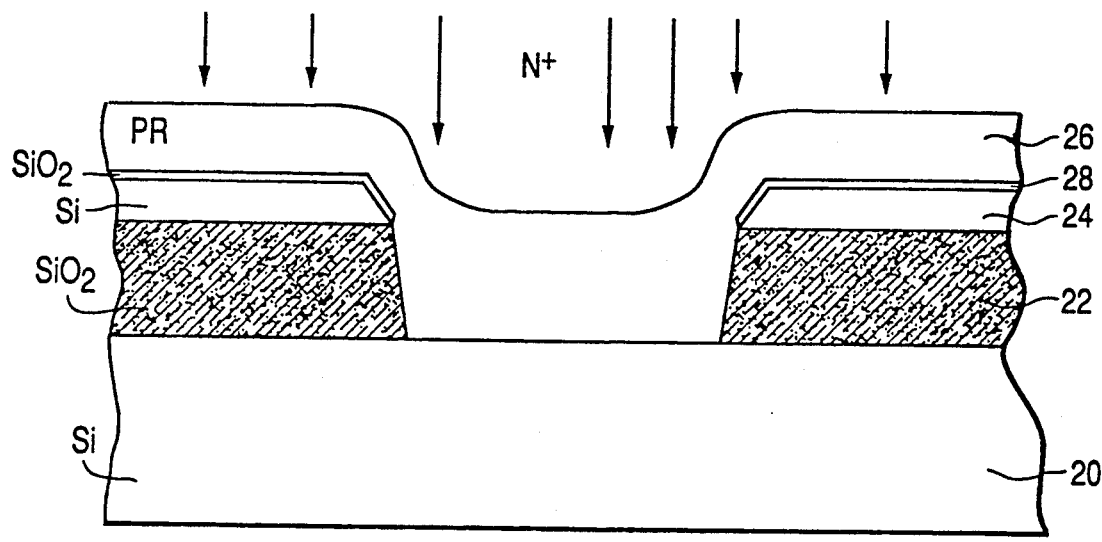
FIGS. 3a and b are cross sectional views of the doping taking place in the substrate contact region.
Figure 3B:
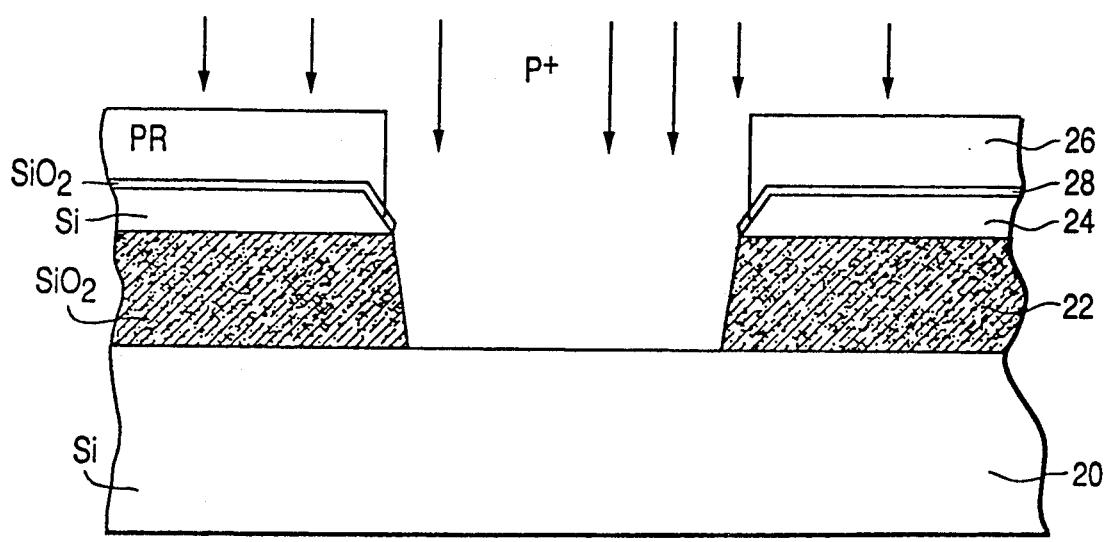

During the source/drain doping, a dopant species of the same type as the wafer substrate is implanted into the exposed substrate. As can be seen in FIG. 3a when implanting into a P-type substrate, photoresist is used as a mask for the N+ implant. In FIG. 3b when implanting the source/drain region of p-channel transistors the trench region is opened up to allow the P+ implant to impinge upon the p-type substrate to allow for a subsequent ohmic contact to the substrate.

With the silicide/metallization of the device, an ohmic contact can be made to the substrate. Contacts can then be made to a ground line or to a biasing conductor lead line.

The process flow is as follows for a p-type wafer:
Define substrate contact rings.
Etch trench in exposed rings down to substrate.
Strip resist.
Standard processing.
Cover substrate contact ring with photoresist during n+ implant.
During p+ source/drain implant, expose contact areas.
Rest of processing is standard.

Figure 4:
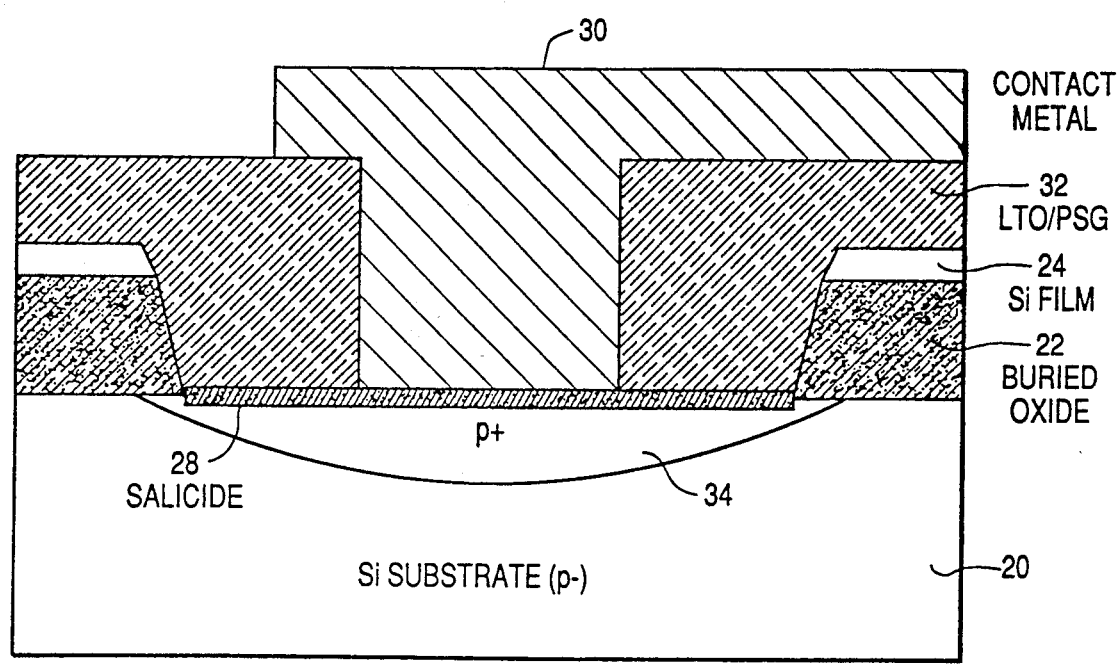
FIG. 4 is a cross sectional view of the frontside ohmic contact to the substrate of an SOI device according to the present invention.

After silicide formation and metallization a cross sectional view of the frontside ohmic contact to an SOI device is shown in FIG. 4. A p+ region 34 underlies the silicide contact to which metal contact metallization 30 has been formed through a low temperature polysilicon glass 32. What results is a metal contact to the frontside of an SOI wafer that can be used as a ground or biasing potential independent of any packaging means without the need for electrical contact to the backside of the silicon substrate 20.

While the invention as been shown with reference to a preferred embodiment, it would be obvious to one of skill in the art that there are various applications and modifications that can be made without departing from the spirit and scope of the invention.

What is claimed is:

1. A method of fabricating a frontside contact to a silicon-on-insulator substrate, the substrate having a dopant type, comprising the steps of:

defining a trench region on the surface of the SOI substrate before normal semiconductor device processing;

etching the SOI layers down to the substrate;

removing any trench defining material and continuing with normal device processing;

opening the trench region during ion implantation of a dopant species of the same type as the substrate;

covering the trench region during ion implantation of a dopant species of a different type as the substrate; and depositing metal in portions of the trench region during normal device processing to form an ohmic contact to the frontside of the SOI substrate.

2. The method according to claim 1 wherein the trench has a sloping edge profile.

3. The method of claim 1 wherein the trench forms a ring around a plurality of active semiconductor devices period.

4. The method of claim 1 wherein the trench is formed as a plurality of rectilinear openings interspaced between active semiconductor devices.

5. In a silicon-on-insulator wafer, a method of forming a frontside contact comprising the steps of:

a) defining a substrate contact region by use of photoresist b) etching a trench in the exposed contact regions;

c) stripping the photoresist and resuming normal device processing;

d) covering the substrate during implantation of a dopant of the opposite type from the substrate;

e) opening the substrate trench region during implantation of similar dopant types to the substrate; and f) resume processing of the remaining fabrication steps to form a metal contact having ohmic contact to the silicon substrate via of the SOI wafer.

* * * * *